(12) United States Patent
Henstra

(10) Patent No.: US 7,999,225 B2
(45) Date of Patent: Aug. 16, 2011

(54) CHARGED PARTICLE SOURCE WITH INTEGRATED ENERGY FILTER

(75) Inventor: Alexander Henstra, Utrecht (NL)

(73) Assignee: FEI Company, Hillsboro, OR (US)

( * ) Notice: Subject to any disclaimer, the term of this patent is extended or adjusted under 35 U.S.C. 154(b) by 219 days.

(21) Appl. No.: 12/472,259

(22) Filed: May 26, 2009

(65) Prior Publication Data

US 2009/0289195 A1    Nov. 26, 2009

(30) Foreign Application Priority Data

May 26, 2008   (EP) ..................... 08156906

(51) Int. Cl.
*H01J 3/26*    (2006.01)
*H01J 40/00*   (2006.01)
(52) U.S. Cl. .................... 250/305; 250/396 R
(58) Field of Classification Search .............. 250/305, 250/396 R–396 ML, 493.1
See application file for complete search history.

(56) References Cited

U.S. PATENT DOCUMENTS

| | | | |
|---|---|---|---|
| 3,622,781 A | | 11/1971 | Liebl |
| 4,590,379 A | * | 5/1986 | Martin ............. 250/396 R |
| 4,853,545 A | | 8/1989 | Rose |
| 5,013,913 A | * | 5/1991 | Benner ............. 250/307 |
| 5,126,565 A | | 6/1992 | Rose |
| 5,221,844 A | | 6/1993 | van der Mast et al. |
| 5,422,486 A | | 6/1995 | Herrmann et al. |

(Continued)

FOREIGN PATENT DOCUMENTS

DE    19633496    2/1998

OTHER PUBLICATIONS

Uhlemann, S., et al., "Experimental Set-Up of a Fully Electrostatic Monochromator for a 200 kV TEM," The Proceedings of the 15th International Congress on Electron Microscopy, Sep. 1-6, 2002, 2 pgs.

(Continued)

*Primary Examiner* — Jack Berman
*Assistant Examiner* — David Smith
(74) *Attorney, Agent, or Firm* — Michael O. Scheinberg; David Griner; Scheinberg & Griner, LLP

(57) ABSTRACT

The invention describes a particle source in which energy selection occurs. The energy selection occurs by sending a beam of electrically charged particles 103 eccentrically through a lens 107. As a result of this, energy dispersion will occur in an image formed by the lens. By projecting this image onto a slit 109 in an energy selecting diaphragm 108, it is possible to allow only particles in a limited portion of the energy spectrum to pass. Consequently, the passed beam 113 will have a reduced energy spread. Deflection unit 112 deflects the beam to the optical axis 101. One can also elect to deflect a beam 105 going through the middle of the lens toward the optical axis and having, for example, greater current.
The energy dispersed spot is imaged on the slit by a deflector 111. When positioning the energy dispersed spot on the slit, central beam 105 is deflected from the axis to such an extent that it is stopped by the energy selecting diaphragm. Hereby reflections and contamination resulting from this beam in the region after the diaphragm are avoided. Also electron-electron interaction resulting from the electrons from the central beam interacting with the energy filtered beam in the area of deflector 112 is avoided.

17 Claims, 5 Drawing Sheets

U.S. PATENT DOCUMENTS

Figure 1:
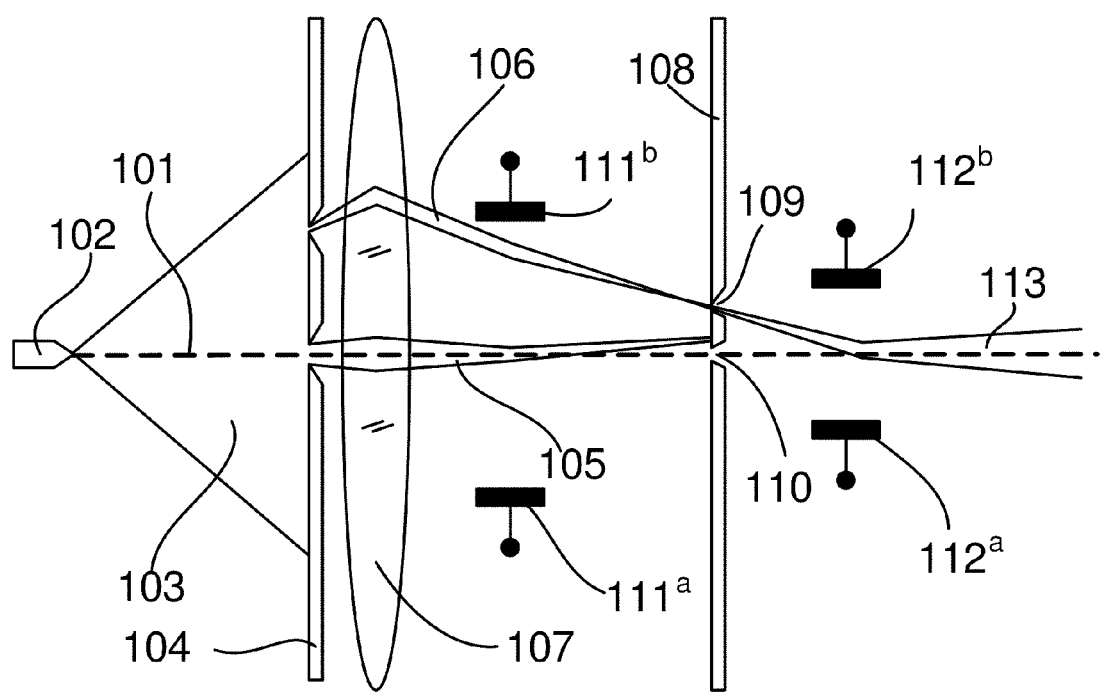

| | | | |
|---|---|---|---|
| 5,448,063 | A | 9/1995 | de Jong et al. |
| 5,798,524 | A | 8/1998 | Kundmann et al. |
| 5,838,004 | A | 11/1998 | Tiemeijer et al. |
| 5,838,011 | A | 11/1998 | Krijn et al. |
| 5,965,894 | A | 10/1999 | Krijn et al. |
| 5,986,269 | A | 11/1999 | Krijn et al. |
| 6,489,621 | B1 | 12/2002 | Frosien |
| 6,501,076 | B1 | 12/2002 | Kelly et al. |
| 6,693,282 | B1 | 2/2004 | Tiemeijer |
| 6,943,349 | B2 | 9/2005 | Adamec et al. |
| 7,034,315 | B2 * | 4/2006 | Henstra et al. ............. 250/398 |
| 7,084,414 | B2 * | 8/2006 | Wieland et al. .......... 250/492.23 |
| 2003/0168606 | A1 | 9/2003 | Adamec et al. |
| 2004/0119023 | A1 | 6/2004 | Nakasuji et al. |
| 2008/0042074 | A1 | 2/2008 | Sato et al. |

OTHER PUBLICATIONS

Benner, Gerd, et al., "Design and First Results of SESAM," Microscopy and Microanalysis, 2003, pp. 66-67, vol. 9, Suppl. 03.

Plies, Erich, et al., "Proposal of a Novel Highly Symmetric Wien Filter Monochromator," Microscopy and Microanalysis, 2003, pp. 28-29, vol. 9, Suppl. 03.

Hibi, Tadatosi, et al., 'On a Slit for Objective Electron Lens,' 1954, vol. 6, pp. 511-516.

Koops, H., "Aberration Correction in Electron Microscopy," The Instrument Today and Tomorrow, Ninth International Congress on Electron Microscopy, p. 185-196, 1978.

* cited by examiner

CHARGED PARTICLE SOURCE WITH INTEGRATED ENERGY FILTER

The invention relates to a charged particle source for producing a beam of charged particles, comprising:
- a charged particle emitting surface emitting charged particles,
- a lens for forming an image of the charged particle emitting surface, said lens showing an optical axis,
- a beam limiting diaphragm for limiting the beam, embodied in such a way that at least two beams are formed, a central beam going through the middle of the lens and an eccentric beam going eccentrically through the lens,
- a deflector embodied to deflect one of the beams towards the axis,
- an energy selecting diaphragm showing an energy selecting aperture for passing a part of the eccentric beam and a central aperture for passing the central beam, said energy selecting diaphragm positioned between the particle emitting surface and the deflector, and
- a second deflector to align the eccentric beam on the energy selecting aperture.

The invention further relates to a particle-optical apparatus equipped with such a charged particle source.

Such a charged particle source is known from U.S. Pat. No. 7,034,315, which is assigned to the assignee of the present invention and which is hereby incorporated by reference. The charged particle beam described therein can be used as e.g. an electron source in an electron microscope, such as a Scanning Electron Microscope (SEM), a Transmission Electron Microscope (TEM) or as an ion source in a Focused Ion Beam (FIB) apparatus.

In an apparatus using a charged particle source the beam is manipulated by particle-optical elements, such as lenses and deflectors. The beam is manipulated to e.g. form a focus on a sample and scan it over the sample.

The size of such a focus on a sample is at least in part determined by the so-named chromatic aberrations. Chromatic aberrations in particle-optical instruments are those aberrations that are caused by the particles in the beam having slightly different energies. For an electron source used in an electron microscope the energy spread of the electrons is typically in the order of between 0.3 to 1 eV, for an ion source used in a FIB the energy spread is typically between 1 and 10 eV. Especially when using low beam energies the relative energy spread ΔE/E is large, resulting in chromatic aberrations.

It is remarked that the chromatic aberrations can be reduced by reducing the beam diameter, but this results in lower beam current and may increase the contribution of the so-named diffraction to the spot size.

It is further remarked that also charged particle apparatus are known in which the sample is not illuminated with a focused beam, but with a parallel beam. In this case as well the chromatic aberrations are important.

The charged particle source described in U.S. Pat. No. 7,034,315 provides a solution to the problem of chromatic aberrations by offering a source with reduced energy spread. This is accomplished by filtering a part of the charged particles showing a relative small energy spread and stopping the rest of the particles. The eccentric beam will, due to the energy dispersive working of the lens, be imaged as an energy dispersed line on the energy selecting diaphragm. The width of the energy selecting aperture in the diaphragm on which it is imaged determines the energy spread of the energy selected beam passing through said aperture.

The known filter uses an off-axis part of a lens as energy dispersive element and forms an image of the particle emitting surface on an energy selective diaphragm. The energy dispersive working of the lens forms a dispersion line on a small aperture in the form of a slit in the diaphragm, passing a part of the energy disperse image and blocking the rest.

A problem of this energy filter is that at least two beams leave the gun module: the central beam and the energy filtered beam. Typically one of these is centred around the axis while the other diverges from the axis. This diverging beam may cause unwanted reflections, contaminations etc.

Another problem is that the charged particles of the energy filtered beam interact with the particles in the central beam. During this interaction the energy spread of the energy filtered beam may increase due to Boersch effect and trajectory displacement.

The invention aims to provide a charged particle source where only one beam leaves the source module.

To this end the particle source according to the invention is characterised in that when the eccentric beam is focused and aligned on the energy selecting aperture using the second deflector, the second deflector simultaneously deflects the central beam to such an extend that the central beam is blocked by the energy selecting diaphragm.

When the eccentric beam is aligned on the energy selecting aperture and passes through the energy selecting diaphragm, the central beam is stopped by the energy selecting diaphragm by slightly deflecting the central beam. Preferably the deflection of the central beam is done by the second deflector by the same deflection action that is needed to align the eccentric beam on the energy selecting aperture.

As a result the central beam does not exit the charged particle source. The particles of the central beam can thus not cause unwanted reflections, contamination or such like. Also charged particle interaction between particles of the energy selected beam and the central beam, such as Boersch effect and trajectory displacement, is eliminated, as the two beams do not mingle.

It is noted that preferably the charged particle source is formed in such a manner and used such that only one beam at a time leaves the charged particle beam.

It is further noted that the beam limiting diaphragm may be placed between the lens and the emitting surface, thereby forming an eccentric beam. However, the beam limiting diaphragm may be placed anywhere between the emitting surface and the second deflector: even when the beam is placed between the lens and the second deflector, an eccentric beam is excised from the beam illuminating the lens by the aperture defining said eccentric beam, resulting in a similar effect as when defining the eccentric beam before entering the lens.

It is also noted that the deflection of the eccentric beam and the central beam can be identical, i.e. that when the eccentric beam is deflected the central beam is deflected over the same angle, but that it is also possible to cause the deflection of the central beam to differ from the deflection of the eccentric beam by forming the second deflector such that the deflection field for the two beams differ in magnitude, extend, or direction.

It is mentioned that the dispersion line may be formed by the addition of a series of round images, each round image corresponding to one energy in the energy dispersed beam. However, also line images (with the line direction perpendicular to the direction of the energy dispersion) can be used, said line images to be formed in a round focus by optics following the gun module.

In an embodiment of the charged particle source according to the invention the further deflector and the lens are integrated in one multipole element.

By using a multipole element with at least two poles, the multipole element can act as a round lens with a deflector superimposed on it. By this integration the total number of parts, and thus the complexity of the gun module, is reduced.

It is noted that such a pole can be either a magnetic pole face or an electrostatic electrode.

It is further noted that such a multipole element has preferably four poles so that the orientation of the dipole can be adjusted.

In a further embodiment of the charged particle source according to the invention the multipole element is equipped to be used as a stigmator for the beam.

By using a multipole with at least four poles, a stigmator field can be superimposed on the lens field and deflector field.

As known to the skilled person such a pole can be a magnetic pole face or an electrostatic electrode. Also the combination of an electrode and a magnetic pole face in one construction element is known to the person skilled in the art.

It is noted that such a multipole element has preferably at least 8 poles so as to adjust the orientation of the stigmator, although a rotatable stigmator can be realised with e.g. a hexapole, that is: with less than eight poles.

In still a further embodiment of the charged particle source according to the invention the multipole element is an electrostatic multipole element.

By forming the poles as (electrostatic) electrodes, a multipole element with small dimensions can be made, resulting in a compact gun module.

In yet another embodiment of the charged particle source according to the invention the energy selecting diaphragm shows a multitude of energy selective apertures for passing a part of the eccentric beam.

The eccentric beam will, due to the energy dispersive working of the lens, be imaged as an energy dispersed line on the energy selecting diaphragm. The width of the energy selecting aperture on which it is imaged determines the energy spread of the energy selected beam passing through said aperture. Multiple energy selective apertures with different widths thus enable the choice of different energy spreads of the energy selected beam. Also, different apertures are attractive so that an alternative aperture can be used when one aperture is e.g. contaminated or damaged. Preferable the slit width in the direction of the dispersion is approximately equal to the geometric image size of the charged particle emitting surface as imaged on the energy selecting diaphragm.

In yet another embodiment of the charged particle source according to the invention a multitude of eccentric beams is formed, each of which eccentric beam may be used as the eccentric beam to pass through an energy selective aperture.

An alternative way to form energy selected beams with different energy spreads is by selecting different eccentric beams that pass the lens in a more or a less eccentric fashion. The more eccentric beam will show more energy dispersion, and will thus for a given aperture result in a beam with less energy spread.

It is noted that the second deflector or the focussing action of the lens can be used to direct the desired eccentric beam to the energy selecting aperture.

In yet another embodiment of the charged particle source according to the invention no eccentric beam passes through the energy selective diaphragm when the central beam passes through the energy selective diaphragm.

Although the effect of reflections and contamination is typically most severe when the central beam should pass through the energy selecting diaphragm and then leave the charged particle source eccentrically (as it is deflected from the axis by the first deflector), as the central beam typically shows a much larger intensity than the eccentric beams, a similar effect occurs when the eccentric beam or beams leave the gun module eccentrically. It is thus advantageous to block all beams that leave the charged particle source eccentrically.

In yet another embodiment of the charged particle source according to the invention the second deflector causes a deflection of the eccentric beam that differs from the deflection of the central beam.

By forming the second deflector such that the deflection field differs for the two beams, a different deflection amplitude or direction may be realized. A special case is where the second deflector comprises a first electrode positioned between the eccentric beam and the central beam and two grounded electrodes, one at the side of the central beam opposite to the side where the first electrode is placed and one at the side of the eccentric beam opposite to the side where the first electrode is placed. This results in a deflection field for each of the beams of opposite direction, and possibly different amplitude, and the beams are thus deflected in different directions.

In yet another embodiment of the invention a particle optical apparatus for forming an image of a sample is equipped with a particle optical source according to the invention.

The charged particle source may be used in e.g. a Scanning Electron Microscope (SEM), a Transmission Electron Microscope (TEM), a Scanning Transmission Electron Microscope (STEM), a Focused Ion Beam instrument (FIB) or any other particle optical apparatus where there is a need for a charged particle source with low energy spread.

In a further embodiment of the particle-optical apparatus according to the invention the apparatus is equipped to form a focused beam on the sample.

A low energy spread is especially important when chromatic aberrations of particle-optical lenses and/or deflectors occur. This is especially the case when a beam is focused on a sample.

In another embodiment of the particle-optical apparatus according to the invention the apparatus is equipped to change the energy of the charged particles produced by the particle optical source and deflected by the deflector towards the axis before the charged particles impinge on the sample.

The charged particle source is typically constructed and optimized for a certain energy range of the charged particles produced. The produced beam of particles can be accelerated or decelerated to another value.

In a further embodiment of the particle-optical apparatus according to the invention the energy change is a lowering of the energy.

A low energy spread is especially important when using a beam of low energy, as a lowering of the energy results in a large relative energy spread $\Delta E/E$ and thus large chromatic aberration. Therefore, when using a charged particle source and then lowering the energy of the particles to a desired energy, an energy filter according to the invention is attractive.

Figure 2:
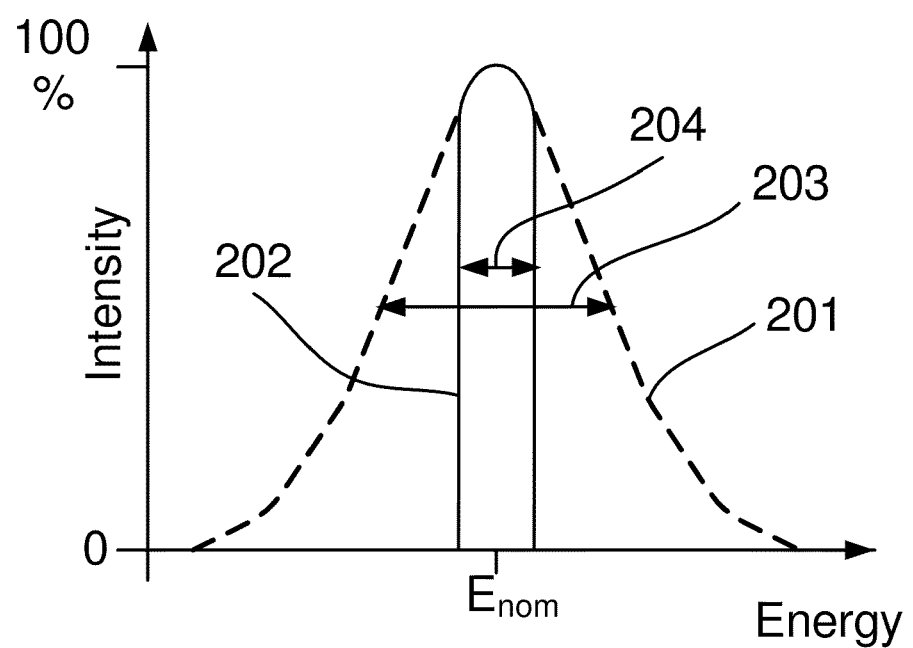
Figure 3:
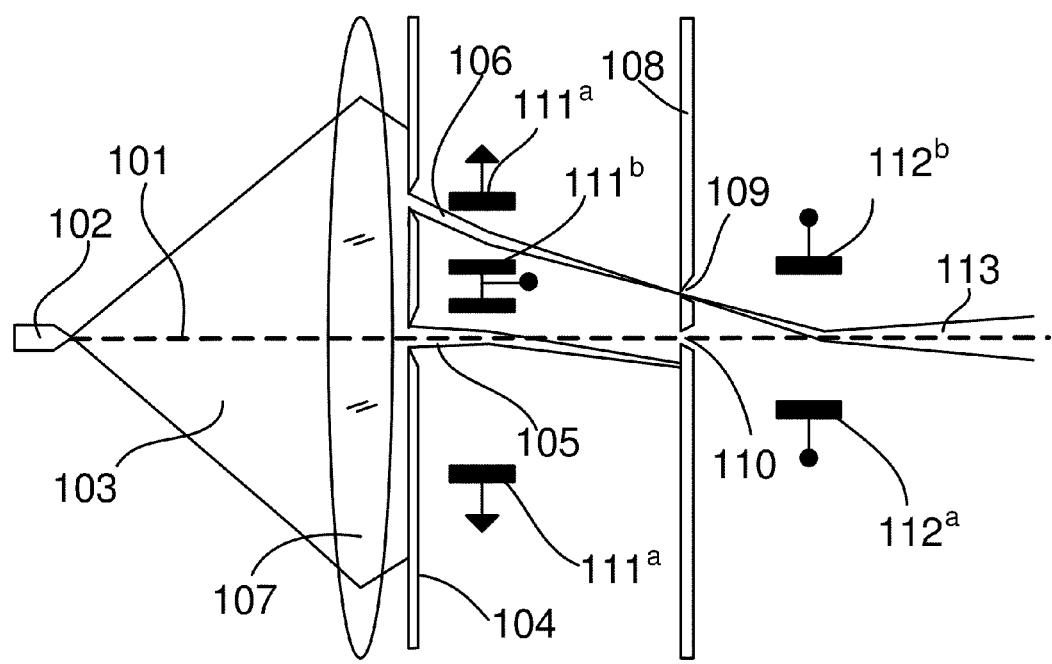
Figure 4:
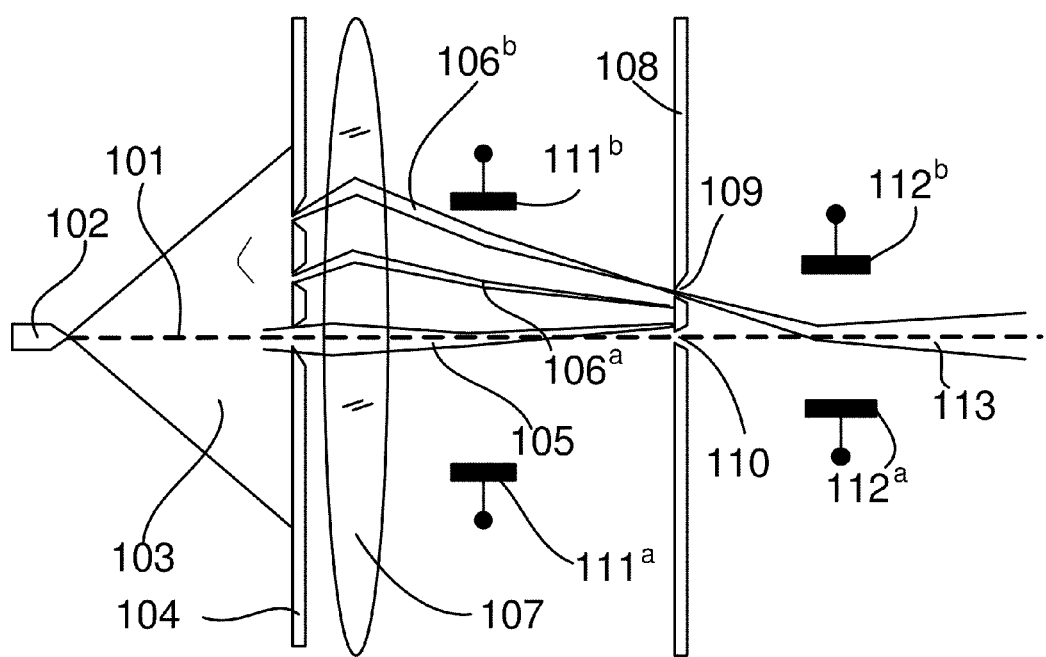
Figure 5:
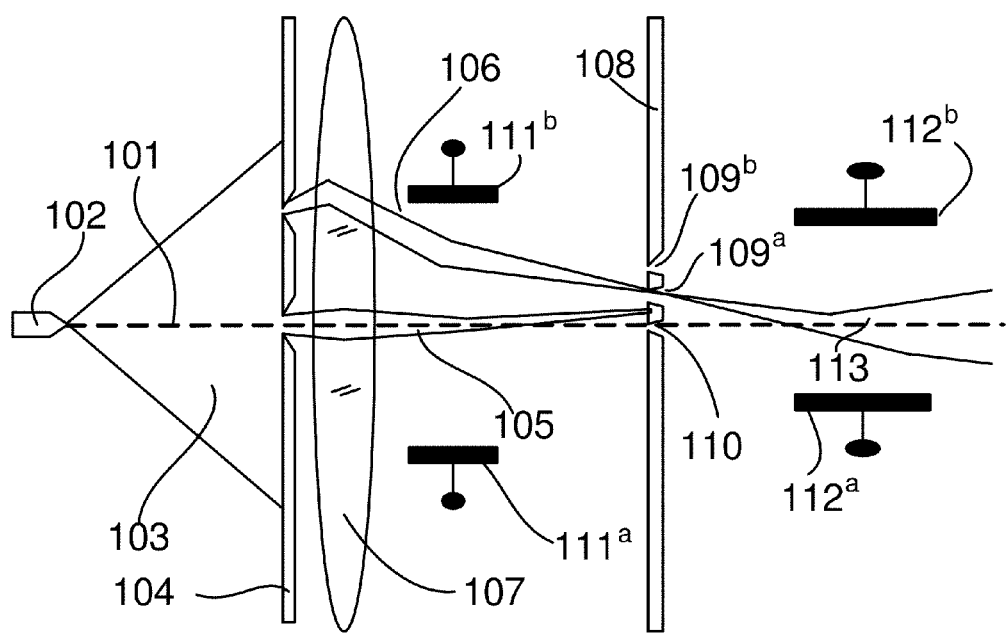

The invention will now be elucidated on the basis of figures, whereby corresponding elements are depicted using identical reference numerals. To this end:

FIG. 1 schematically shows a charged particle source according to the invention in which the central beam is blocked, FIG. 2 schematically shows the energy distribution of the unfiltered and filtered beam exciting the particle source, FIG. 3 schematically shows an alternative embodiment of the particle source according to the invention, FIG. 4 schematically shows another alternative embodiment of the particle source according to the invention, and FIG. 5 schematically shows yet another alternative embodiment of the particle source according to the invention FIG. 1 schematically shows a charged particle source according to the invention in which the central beam is blocked.

A charged particle emitting surface 102 produces a beam of charged particles 103 round an axis 101. A beam limiting diaphragm 104 blocks part of the emitted particles and passes at least two beams, an axial beam 105 centred around the axis and an off-axis beam 106. The axial beam 105 passes centrally through particle-optical lens 107, while the off-axis beam passes through said lens eccentrically. The lens focuses the particle emitting surface 102 on the energy selecting diaphragm 108. The energy selecting diaphragm shows two apertures, a central aperture 110 to pass the central beam (when said beam is not deflected) and an eccentric aperture 109 for passing a part of beam 106. A deflector 111, here schematically depicted by two deflector plates $111^a$ and $111^b$, aligns the eccentric beam on the energy selecting eccentric aperture 109 in such a way that the most intense part of the beam passes through the eccentric aperture 109. As the lens typically focuses low energetic particles stronger than high energetic particles, an energy dispersed line pointed to the axis is formed on the energy selecting diaphragm. The width of the eccentric aperture in the radial direction determines the energy spread of the energy selected beam 113. Deflector 112, here schematically depicted by two deflector plates $112^a$ and $112^b$, aligns the eccentric beam round the axis.

When deflector 111 is not active, that is: when the central beam 105 is centred around the axis 101, the central beam passes through the central aperture 110 of the energy selecting diaphragm 108. Typically the central beam is the beam with the largest current when compared to the eccentric beam 106. In this situation, where beam 105 is not deflected, eccentric beam 106 is typically blocked by the energy selecting diaphragm. When deflecting the eccentric beam so as to align it on the eccentric aperture 109, the central beam is deflected as well. The deflection of the central beam is sufficient to position the (focused) central beam on the material of the energy selecting diaphragm and not on the central aperture. Thereby passage of the central beam is blocked and only a part of the eccentric beam passes the energy selecting diaphragm to form the energy selected beam 113. This energy selected beam 113 is then deflected round the axis 101 to be manipulated (focused, deflected, scanned, etc.) by the rest of the apparatus in which the charged particle source is used.

It is noted that even when passing the central beam through the energy selecting diaphragm, it may be necessary to apply a deflection to the central beam to centre it on the central aperture 110. This can be used to counter misalignments of the electrodes, or to counter a mechanical displacement and/or drift of the emitting surface, such as a Schottky emitter.

FIG. 2 schematically shows the energy distribution of the unfiltered and filtered beam exciting the particle source.

The energy distribution of the unfiltered beam is given by curve 201. It shows the intensity as a function of the energy deviation from a nominal energy $E_{nom}$. $E_{nom}$ can be changed by accelerating or decelerating the beam. Often this energy distribution curve 201 is assumed to be a Gaussian distribution, characterized by the Full Width at Half Maximum (FWHM) energy spread 203. For electron sources the FWHM energy spread is typically between 0.5 to 1 eV, for liquid metal ion sources typically between 3 to 10 eV.

By filtering a small part of the electrons a distribution 202 can be obtained, which has a FWHM energy spread 204. As known to the person skilled in the art such a filtered beam, although having less total current than an unfiltered beam, can in those cases where the chromatic aberration of a lens dominates be focused in a much smaller focus and results in a higher current density in the focus.

FIG. 3 schematically shows an alternative embodiment of the particle source according to the invention.

FIG. 3 can be thought to be derived from FIG. 1. The beam limiting aperture 104 is now placed between the lens 107 and the second deflector 111. Further the second deflector is now formed as an electrode $111^b$ placed between the eccentric beam 106 and the central beam 105, and two grounded electrodes $111^a$ on the opposite side of each of the beams. As a result the eccentric beam is deflected in a direction opposite to the direction over which the central beam is deflected.

It is remarked that a different spacing of the two electrodes $111^a$ with respect to electrode $111^b$ results in different deflection field strengths, and thus different magnitude of the angle over which the beams are deflected. This arrangement of the deflector 111 can thus give rise to different mutual directions and magnitudes of the deflection angles of the two beams, thereby offering additional design flexibility.

FIG. 4 schematically shows an alternative embodiment of the particle source according to the invention. The embodiment shown in FIG. 3 is similar to that shown in FIG. 1, but the beam limiting diaphragm 104 passes three beams, axial beam 105, off-axis beam $106^a$, and a second off-axis beam $106^b$. By adjusting the voltage on deflectors $111^a$ and $111^b$, either one of beam $106^a$ or beam $106^b$ can be selected to pass through aperture 109, or beam 105 can be selected to pass through aperture 110. Preferably only a single beam leaves the source.

FIG. 5 schematically shows an alternative embodiment of the particle source according to the invention. The embodiment shown in FIG. 5 is similar to that shown in FIG. 1, but includes multiple energy selecting apertures, $109^a$ and $109^b$, through which eccentric beam 106 can be deflected, thereby enabling a choice of different energy spreads for the selected energy beam. Other embodiments could combine the multiple apertures in beam limiting diaphragm 104 of FIG. 4 with the multiple energy selecting apertures of FIG. 5. The multiple apertures in beam limiting diaphragm 104 shown in FIG. 4 and the multiple energy selecting apertures 109 shown in FIG. 5 could also be implemented separately or together in embodiments similar to FIG. 3, that is, embodiments having multiple deflectors before the energy selecting aperture or having the lens positioned before the beam limiting diaphragm.

It is noted that it is also possible to use this source with the lens 107 not or almost not excited, so that the central beam is not or almost not focused by said lens. It is then possible to extract a central beam with another current from the gun module. Also exciting the lens sufficiently strong to form a cross-over between the lens and the energy selecting aperture is foreseen as a use to extract a desired current from the module, using the central beam. This enables the central beam, that is not energy selected to be chosen, with an appropriate current by tuning lens 107, and to use the eccentric beam with a setting of the lens 107 in which the emitting surface is imaged on the energy selecting diaphragm. Multiple charged particle emitting surfaces 102 could be used in any embodiments, as shown in U.S. Pat. No. 7,034,315, FIG. 3. It is remarked that the use of a gun module in this mode, using an extra lens in the gun module, is described in U.S. Pat. No. 6,693,282.

What I claim:

1. Charged particle source for producing a beam of charged particles, comprising
    a charged particle emitting surface emitting charged particles,
    a lens for forming an image of the charged particle emitting surface, said lens having an optical axis
    a beam limiting diaphragm for limiting of the beam, embodied in such a way that at least two beams are formed, a central beam going through the middle of the lens and an eccentric beam going eccentrically through the lens,
    a first deflector embodied to deflect one of the beams towards the axis, and
    an energy selecting diaphragm showing an energy selecting aperture for passing a part of the eccentric beam and a central aperture for passing the central beam, said energy selecting diaphragm positioned between the particle emitting surface and the deflector, and
    a second deflector to align the eccentric beam on the energy selecting aperture, the source configured such that when the eccentric beam is focused and aligned on the energy selecting aperture using the second deflector, the second deflector simultaneously deflects the central beam to such an extent that the central beam is blocked by the energy selecting diaphragm.

2. The charged particle source according to claim 1 in which the second deflector and the lens are integrated in one multipole element.

3. The charged particle source according to claim 2 in which the multipole element is equipped to be used as a stigmator for the beam.

4. The charged particle source according to claim 2 in which the multipole element is an electrostatic multipole element.

5. The charged particle source according to claim 1 in which the energy selecting diaphragm shows a multitude of energy selective apertures for passing a part of the eccentric beam.

6. The charged particle source according to claim 1 in which a multitude of eccentric beams is formed, each of which eccentric beam may be used as the eccentric beam to pass through an energy selective aperture.

7. The charged particle source according to claim 1 in which no eccentric beam passes through the energy selective diaphragm when the central beam passes through the energy selective diaphragm.

8. The charged particle source according to claim 1 in which the second deflector causes a deflection of the eccentric beam that differs from the deflection of the central beam.

9. A particle optical apparatus for forming an image of a sample equipped with a particle optical source according to claim 1.

10. The particle optical apparatus according to claim 9 in which the apparatus is equipped to form a focused beam on the sample.

11. The particle optical apparatus according to claim 9 in which the apparatus is equipped to change the energy of the charged particles produced by the charged particle source and deflected by the deflector towards the axis before the charged particles impinge on the sample.

12. The particle optical apparatus according to claim 11 in which the energy change is a lowering of the energy.

13. Charged particle source for producing a beam of charged particles, comprising
    a charged particle emitter;
    a lens for focusing the charged particles emitted by the emitter into a beam, said lens having an optical axis;
    multiple first apertures for producing at least two beams including, a central beam passing through the center of the lens and at least one eccentric beam passing through the lens away from its center;
    a deflector for selecting either the central beam or one of the eccentric beams to pass through a corresponding aperture and out of the charged particle source, the beams not selected being blocked so that a single beam leaves the charged particle source.

14. The charged particle source of claim 13 further comprising an additional aperture, the additional aperture corresponding to the at least one eccentric beam and comprising an energy filtering aperture for reducing the energy spread of the eccentric beam.

15. The charged particle source of claim 13 in which the deflector is a multipole deflector.

16. The charged particle source of claim 13 further comprising an additional deflector for selectively deflecting the one of the eccentric beam so that the one of the eccentric beam exits the charged particle source essentially parallel to the optical axis.

17. The charged particle source of claim 13 in which the multiple first apertures produce multiple eccentric beams, and apertures corresponding to the multiple eccentric beams comprise one or more energy filtering aperture for reducing the energy spread of the beam leaving the source.

* * * * *